United States Patent [19]

Ichinose

[11] Patent Number: 4,532,496

[45] Date of Patent: Jul. 30, 1985

[54] PULSE WIDTH MODULATION TYPE DIGITAL TO ANALOG CONVERTER

[75] Inventor: Kazuaki Ichinose, Yokohama, Japan

[73] Assignee: Tokyo Shibaura Denki Kabushiki Kaisha, Japan

[21] Appl. No.: 624,747

[22] Filed: Jun. 26, 1984

Related U.S. Application Data

[63] Continuation of Ser. No. 361,071, Mar. 23, 1982, abandoned.

[30] Foreign Application Priority Data

Mar. 23, 1981 [JP] Japan .................................. 56-40494
Mar. 23, 1981 [JP] Japan .................................. 56-40495

[51] Int. Cl.³ .......................................... H03K 13/02
[52] U.S. Cl. ......................... 340/347 DA; 340/347 M
[58] Field of Search ............... 340/347 DA, 347 CC, 340/347 M; 455/179

[56] References Cited

U.S. PATENT DOCUMENTS 3,836,908 9/1974 Hegendorfer .
4,096,475 6/1978 Ong .

FOREIGN PATENT DOCUMENTS 2322486 3/1977 France .
2000653 1/1979 United Kingdom .

OTHER PUBLICATIONS

The Engineering Staff of Analog Devices, Inc., Analog-Digital Conversion Handbook, Jun. 1982, pp. I-8, II-80 and 81.

Primary Examiner—T. J. Sloyan
Attorney, Agent, or Firm—Finnegan, Henderson, Farabow, Garrett & Dunner

[57] ABSTRACT

A DA converter has an N-bit binary counter which counts pulses of a predetermined frequency to generate a plurality of binary numbers within one conversion period. The binary counter supplies an output of lower n significant bits (n−1<N) to the upper (N−n+1)th to Nth bits of a comparator, and inverts an output of the upper (N−n) bits in order and supplies the inverted signal to the least significant bit to the (N−n)th bit of the comparator. The comparator sequentially compares digital data to be converted with the binary number output from the binary counter. The comparator then supplies the comparison results, pulses, to a low-pass filter. The low-pass filter converts a pulse train output by the comparator into a dc output.

4 Claims, 18 Drawing Figures 4,532,496

PULSE WIDTH MODULATION TYPE DIGITAL TO ANALOG CONVERTER

This is a continuation of application Ser. No. 361,071, filed Mar. 23, 1982 abandoned.

BACKGROUND OF THE INVENTION

The present invention relates to a digital-to-analog converter DA converter which converts a digital signal into an analog signal of a corresponding magnitude and, more particularly, to a pulse width modulated (PWM)-type DA converter having an improved conversion speed and which is capable of effectively attenuating the ripple components of the PWM waves.

According to a general PWM-type DA converter, an input digital signal to be converted is compared with a reference digital signal which changes in magnitude within one period. Based on the comparison result obtained, a pulse signal PWM wave, having a of the pulse width corresponding to the magnitude of the input digital signal is generated. This PWM wave is smoothed to obtain an output analog signal. A DA converter of this type has an advantage in that the conversion precision can be easily improved by increasing the number of bits of the reference digital signal. The PWM-type DA converter is, therefore, widely adopted especially in servo control of motors since it is easily integrated. However, the pWM-type DA converter also has disadvantages. For example, the output analog signal is determined only one period after the reference digital signal. Since the input signal is passed through a low-pass filter for the purpose of smoothing, the conversion speed is slower than that obtainable with DA converters of other types. Furthermore, the smoothing is insufficient and the ripple components tend to be included in the output signal.

SUMMARY OF THE INVENTION

An object of the present invention is to provide a DA converter which is capable of improving the conversion speed and which is capable of producing dc outputs of good quality by effectively attenuating the ripple components of the PWM waves.

To achieve the objects and in accordance with the pupose of the invention, as embodied and broadly described herein, the DA converter of this invention comprises storing means for temporarily storing N-bit digital data to be DA converted; digital value string generating means for counting pulses of a predetermined frequency to generate a plurality of dispersed digital value strings to be compared with the digital data within one conversion period and in correspondence with digital values varying within the conversion period; N-bit comparing means, connected to said storing means and said digital value string generating means, for sequentially comparing each of the plurality of digital value strings with the digital data so as to output pulses corresponding to the number of the digital value strings; and smoothing means, connected to said N-bit comparing means, for converting the pulses generated within the conversion period by said N-bit comparing means into an analog signal.

According to the DA converter of the present invention, a plurality of digital value strings which are obtained in correspondence with digital values changing within one conversion period are sequentially generated as dispersed within this conversion period. The digital value strings and the input digital data are compared to generate PWM waves. Therefore, the cut-off frequency of the low-pass filter for smoothing the PWM waves can be set significantly higher than that with the conventional DA converters, so that the conversion speed may be increased and the ripple components of the PWM waves may be effectively attenuated. Accordingly, analog outputs of good quality may be obtained.

BRIEF DESCRIPTION OF THE DRAWINGS

By way of example and to make the description clearer, reference is made to the accompanying drawings in which.

DETAILED DESCRIPTION OF THE PREFERRED EMBODIMENTS

The present invention will now be described in detail with reference to the accompanying drawings.

Figure 1:
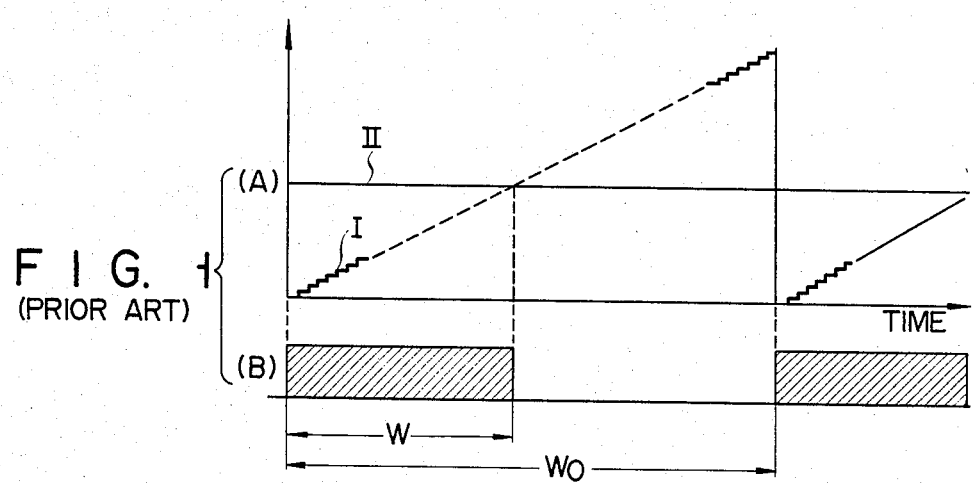
FIGS. 1(A) and 1(B) show waveforms for explaining the conversion principle of a conventional DA converter.
Figure 2:
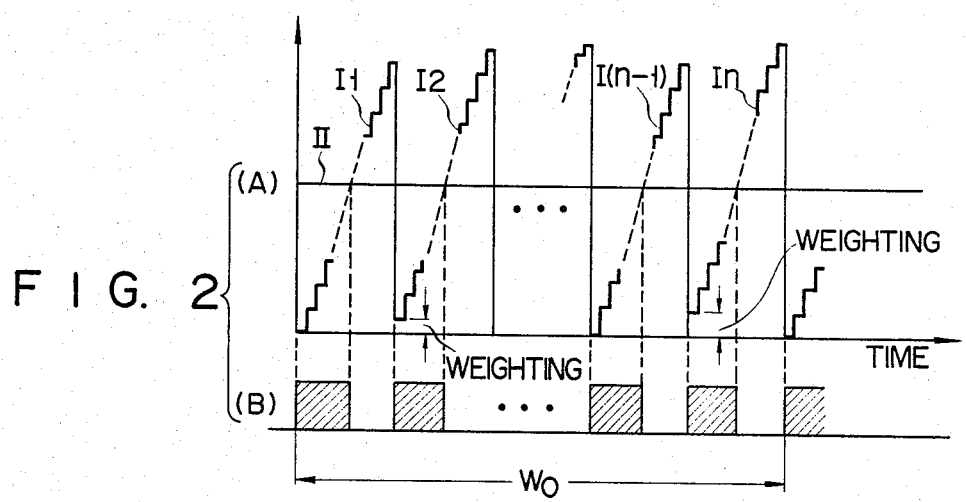
FIGS. 2(A) and 2(B) show waveforms for explaining the conversion principle of a DA converter according to the present invention.

The principle of DA conversion according to the present invention will first be described with reference to FIGS. 1(A), 1(B), 2(A) and 2(B). FIGS. 1(A) and 1(B) show the waveforms for explaining the conversion principle of a prior art DA converter. According to this DA converter, digital value strings (indicated by staircase wave I) sequentially generated within a conversion period WO are compared with input digital data (indicated by line II). Based on the comparison result obtained, PWM waves of pulse width W are generated within regions where the staircase wave I is smaller (or greater) in magnitude than line II. By smoothing the PWM waves, analog signals-proportional to W/WO are obtained. In contrast with this, the principle of DA conversion according to the present invention is shown in FIGS. 2(A) and 2(B). According to the DA converter of the present invention, as shown in FIGS. 2(A) and 2(B), n strings of digital values (indicated by staircase waves I1, I2, . . . , In) are generated sequentially within the conversion period WO. These digital value strings are compared with the input digital data (indicated by line II). Pulse signals of a predetermined pulse width are generated where regions wherein the staircase waves I1, I2, ..., In are smaller (or greater) in magnitude than line II. It is to be noted that these staircase waves I1, I2, ..., In are generated in correspondence with the digital values of the staircase wave I shown in FIG. 1(A) and respectively have different weights. These staircase waves are generated as dispersed. With the DA converter of the configuration as described above, the cut-off frequency of the low-pass filter for smoothing the PWM waves can be made sufficiently high since n pulses are generated within one conversion period.

Figure 3:
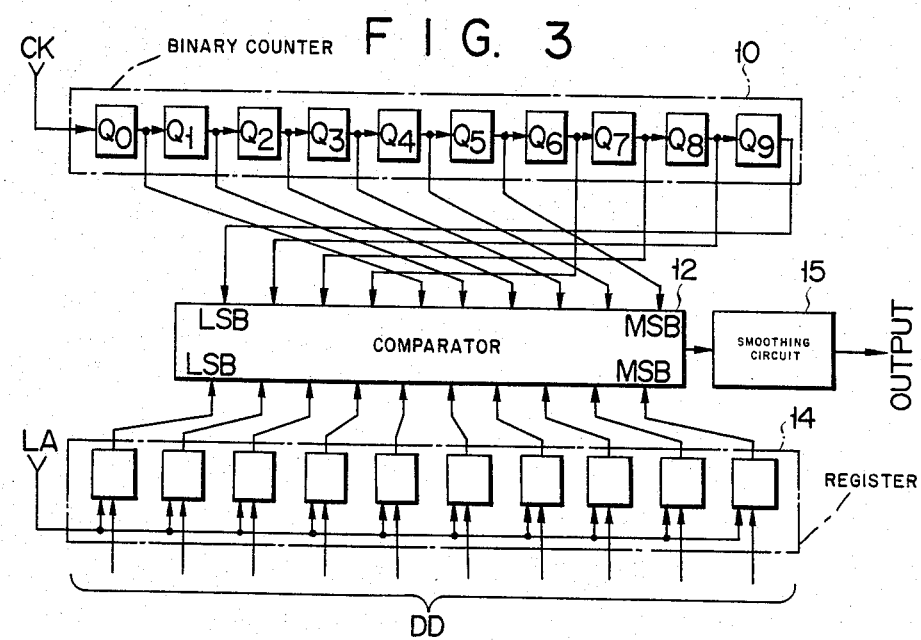
FIG. 3 is a circuit diagram of a DA converter according to the first embodiment of the present invention.

FIG. 3 shows a circuit diagram of a DA converter according to the first embodiment of the present invention. The DA converter of this embodiment has a 10-bit binary counter 10 of up-counter type which receives clock pulses CK of a predetermined frequency, a comparator 12 which compares two binary numbers and produces an output representing which one of the two binary numbers is greater or smaller, a 10-bit register 14 for temporarily storing 10-bit digital data DD to be converted, and a smoothing circuit 15 comprising, for example, a low-pass filter for smoothing the pulse signals generated by the comparator 12. The 10-bit binary counter 10 counts the received clock pulses CK and generates a 10-bit binary number which is sequentially incremented. When each bit of the 10-bit binary number is represented by Q0, Q1, ..., Q9 from the least significant bit (LSB), the lower six significant bits Q0, Q1, ..., Q5 are applied to the upper six significant bits of the comparator 12 in this order whereas the upper four significant bits Q6 to Q9 are inverted in order and are applied to the lower four significant bits of the comparator 12. Then, the binary number input to the comparator 12 may be given as:

$$Q9 \times 2^0 + Q8 \times 2^1 + Q7 \times 2^2 + Q6 \times 2^3 + Q0 \times 2^4 + Q1 \times 2^5 + Q2 \times 2^6 + Q3 \times 2^7 + Q4 \times 2^8 + Q5 \times 2^9$$
$$= (Q9 \times 2^0 + Q8 \times 2^1 + Q7 \times 2^2 + Q6 \times 2^3) + 2^4(Q0 \times 2^0 + Q1 \times 2^1 + Q2 \times 2^2 + Q3 \times 2^3 + Q4 \times 2^4 + Q5 \times 2^5)$$

This binary number defines $2^4$ binary number strings of $2^6$ steps with one step corresponding to $2^4$ (the binary number strings are indicated by staircase waves I1 to I16). These binary number strings respectively have different weights $(Q9 \times 2^0 + Q8 \times 2^1 + Q7 \times 2^2 + Q6 \times 2^3)$. These weights are shown in Table 1 below based upon the relations with bits Q6 to Q9.

TABLE 1

| Q9 | Q8 | Q7 | Q6 | Decimal Number | Q6 | Q7 | Q8 | Q9 | Decimal Number |
|---|---|---|---|---|---|---|---|---|---|
| 0 | 0 | 0 | 0 | 0 | 0 | 0 | 0 | 0 | 0 |
| 0 | 0 | 0 | 1 | 1 | 1 | 0 | 0 | 0 | 8 |
| 0 | 0 | 1 | 0 | 2 | 0 | 1 | 0 | 0 | 4 |
| 0 | 0 | 1 | 1 | 3 | 1 | 1 | 0 | 0 | 12 |
| 0 | 1 | 0 | 0 | 4 | 0 | 0 | 1 | 0 | 2 |
| 0 | 1 | 0 | 1 | 5 | 1 | 0 | 1 | 0 | 10 |
| 0 | 1 | 1 | 0 | 6 | 0 | 1 | 1 | 0 | 6 |
| 0 | 1 | 1 | 1 | 7 | 1 | 1 | 1 | 0 | 14 |
| 1 | 0 | 0 | 0 | 8 | 0 | 0 | 0 | 1 | 1 |
| 1 | 0 | 0 | 1 | 9 | 1 | 0 | 0 | 1 | 9 |
| 1 | 0 | 1 | 0 | 10 | 0 | 1 | 0 | 1 | 5 |
| 1 | 0 | 1 | 1 | 11 | 1 | 1 | 0 | 1 | 13 |
| 1 | 1 | 0 | 0 | 12 | 0 | 0 | 1 | 1 | 3 |
| 1 | 1 | 0 | 1 | 13 | 1 | 0 | 1 | 1 | 11 |
| 1 | 1 | 1 | 0 | 14 | 0 | 1 | 1 | 1 | 7 |

TABLE 1-continued

| Q9 | Q8 | Q7 | Q6 | Decimal Number | Q6 | Q7 | Q8 | Q9 | Decimal Number |
|---|---|---|---|---|---|---|---|---|---|
| 1 | 1 | 1 | 1 | 15 | 1 | 1 | 1 | 1 | 15 |

Thus, the values from the LSB to the fourth bit input to the comparator 12 are such that the orders of decimal numbers 0 to 15 are dispersed at maximum as shown in the right column of Table 1 above. On the other hand, the digital data DD to be converted is temporarily stored in the 10-bit register 14 and supplied to the comparator 12 in response to a load signal LA. The comparator 12 sequentially compares the digital data DD with the binary number strings supplied from the binary counter 10 and produces the comparison outputs. Some comparison outputs produced by the comparator 12 differ by one step from other comparison outputs according to the weights of the binary number strings to be compared with the digital data DD. For example, when the digital data DD to be converted is $555 = 2^9 + 2^5 + 2^3 + 2^1 + 2^0 = 11 + 2^4 \times 34$, the binary number string reaches the value of the digital data DD, 555, at the 34th step when the weight is 11. Therefore, the comparison outputs are produced by the comparator 12 within the range of 34 steps for the binary number string whose weight exceeds 11. On the other hand, the comparison outputs are produced by the comparator 12 within the range of (34+1) steps for the binary number string whose weight is 11 or less. Thus, the comparison outputs from the comparator 12 are produced in correspondence with (34+1), (34+1), (34+1), 34, (34+1), (34+1), (34+1), 34, (34+1), (34+1), (34+1), 34, (34+1) and 34 steps in the example shown in Table 1. In Table 1, weights with which outputs are obtained in correspondence with 34 steps are indicated with symbol o. Thus, most of the comparison outputs (pulse train) are produced by the comparator 12 over the range of 35 steps; the comparison output are produced over the range of 34 steps at the positions of maximum dispersion in this pulse train within the conversion period. As may be apparent from the above description, the pulse widths only differ in correspondence with one step. Since one step is a very small difference equivalent to the LSB of the digital data to be converted, the pulse widths are nearly equal to each other. The pulse train obtained in this manner is supplied to the smoothing circuit 15. The smoothing circuit 15 converts the PWM wave into a dc output from which the ripple components are effectively attenuated.

In this case, pulses of a pulse width having data of $35/2^6 = 0.546875$ (100.9%) for a DA conversion true value of $555/2^{10} = 0.541992$ are obtained within a duration of 1/16 the conversion period. Apart from this, a correction of the pulse width by $-1/2^6$ per ¼ duration of the conversion period $(-1/2^6 \times ¼ = -0.00391$ $(-0.7\%))$ is considered to be performed with a further correction by $-1/2^6$ of the pulse width per conversion period, i.e., $-1/2^6 \times 1/16 = -0.00098$ $(-0.2\%)$. When this correction is performed, a DA conversion of $555/2^{10}$ per conversion period is obtained with high accuracy.

According to the first embodiment described above, an analog output signal close to an objective value is obtained per duration which is 1/16 the conversion period. At the same time, a correction equivalent to the LSB of the data to be converted is small and effectively dispersed within one conversion period. Therefore, the conversion speed becomes faster than that of the conventional DA converters. Furthermore, according to the first embodiment, the cut-off frequency of the smoothing circuit (low-pass filter) 15 for smoothing the PWM waves can be made nearly 16 times that with the conventional DA converter. In addition, the ripple components of the PWM waves can be effectively attenuated so that an analog output of good quality may be obtained.

In the first embodiment described above, the weights of the binary number strings are generated within one period of the staircase wave. However, the present invention is not limited to this. Thus, similar effects may be obtained by generating the weights over a duration of two periods.

Figure 5:
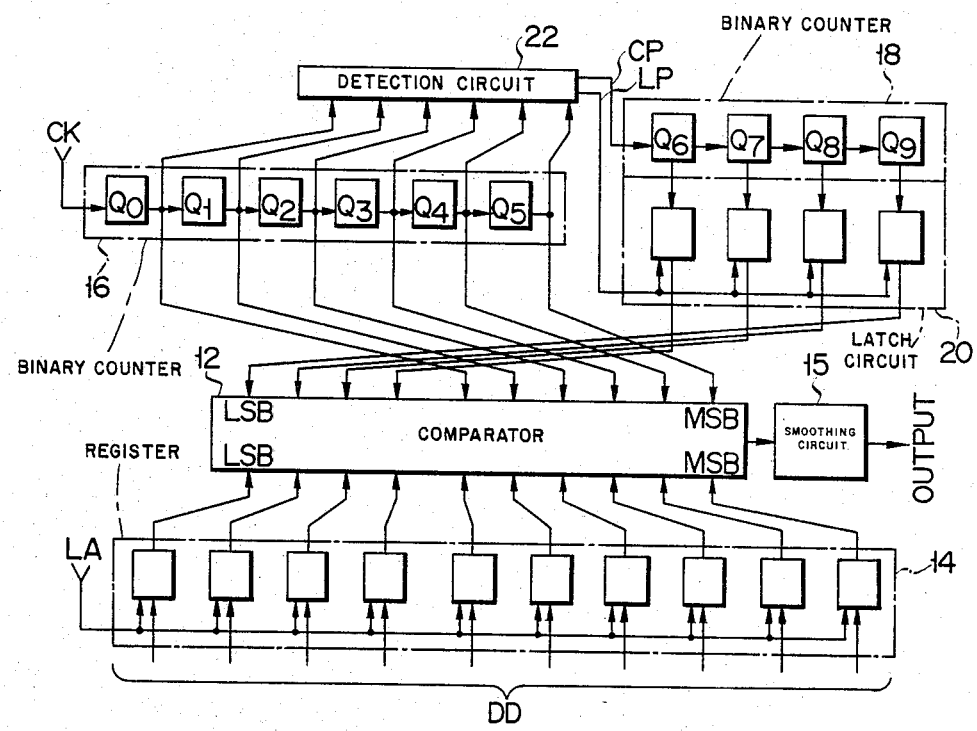
FIG. 5 is a circuit diagram of a DA converter according to the second embodiment of the present invention.
Figure 6:
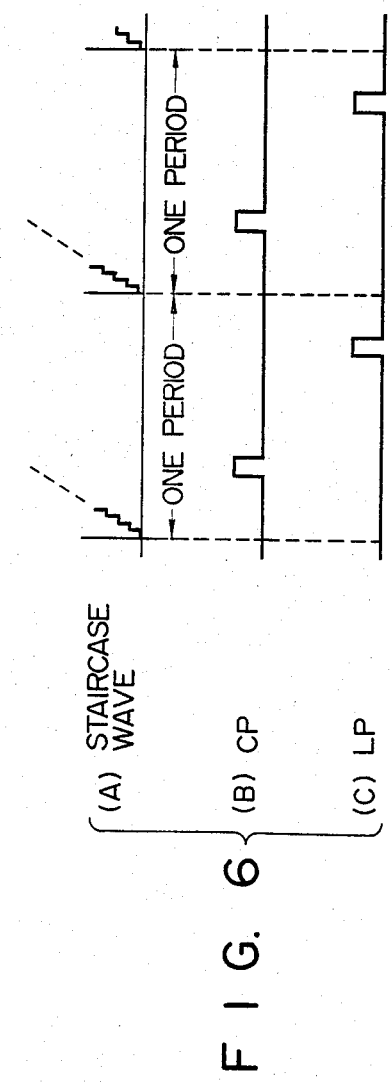
FIGS. 6(A), 6(B) and 6(C) show waveforms for explaining the mode of operation of the DA converter shown in FIG. 5.

The second embodiment of the present invention as shown in FIG. 5 achieves this. The same reference numerals in FIG. 5 as those in FIG. 3 denote the same parts. The DA converter of the second embodiment comprises a 6-bit binary counter 16 for receiving the clock pulse CK, a 4-bit binary counter 18, a latch circuit 20 for latching the output from the 4-bit binary counter 18, and a detection circuit 22 which supervises the count of the 6-bit binary counter 16 and which generates a count pulse CP for the 4-bit binary counter 18 and a latch pulse LP for the latch circuit 20. When the staircase waves from the 6-bit binary counter 16 have the period as shown in FIG. 6(A), a count pulse CP is generated by the detection circuit 22 after a fixed duration from the beginning of each staircase wave, as shown in FIG. 6(B), to increment the count of the 4-bit binary counter 18 by one. A latch pulse LP is generated after another fixed duration from the count pulse CP, as shown in FIG. 6(C), to latch the count of the 4-bit binary counter 18 in the latch circuit 20. The bits Q0 to Q5 of the output from the 6-bit binary counter 16 are directly supplied to the upper six significant bits of the 10-bit comparator 12, whereas the latched content in the latch circuit 20 is reversed in the order of bits and supplied to the lower four significant bits of the 10-bit comparator 12. Other details of the arrangement remain the same as those of the embodiment shown in FIG. 3. With this configuration, the weights of the respective staircase waves change when the latch pulses LP are generated by the detection circuit 22; all the weights are generated within one conversion period. As may be easily understood, according to this embodiment, it suffices that the output data from the 4-bit binary counter 18 be established substantially within the period of each staircase wave. Therefore, the operation speed of the 4-bit binary counter 18 may be significantly lowered in comparison with that of the 6-bit binary counter 16. The second embodiment has an advantage in manufacture of the DA converter in addition to the advantages obtained with the first embodiment.

Figure 7:
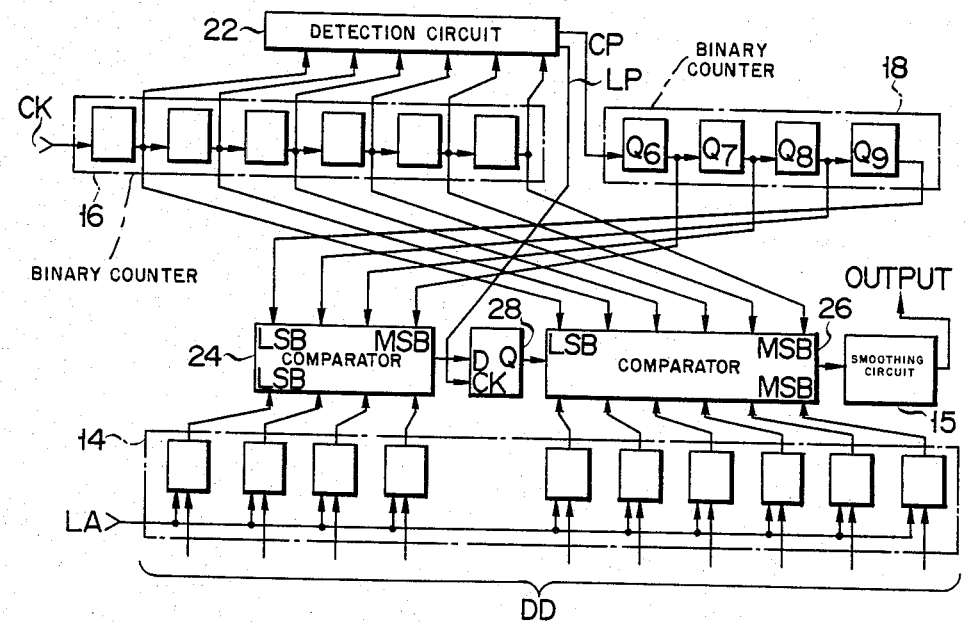
FIG. 7 is a circuit diagram of a DA converter according to the third embodiment of the present invention.

FIG. 7 shows the third embodiment of the present invention. According to this third embodiment, a 4-bit comparator 24 for comparing the lower four significant bits and a 6-bit comparator 26 for comparing the upper six significant bits are incorporated in place of the 10-bit comparator 12 shown in FIG. 5. The 4-bit comparator 24 first compares the inverted signal of the output signal from the 4-bit binary counter 18 with the lower four significant bits of the binary number to be converted. The comparison output from the 4-bit comparator 24 is latched in a latch circuit 28 in response to the latch pulse LP from the detection circuit 22. The latched content in the latch circuit 28 is supplied to the 6-bit comparator 26. The 6-bit comparator 26 has the priority for producing the comparison output over the 4-bit comparator 24, and the 6-bit comparator 26 receives the comparison output from the 4-bit comparator only when the data to be compared coincide with each other. Since the digital data DD to be converted within the conversion period remains constant, the weights of the respective staircase waves change when the latch pulses are generated by the detection circuit 22 as in the case of the second embodiment shown in FIG. 5. Therefore, the output PWM waves are the same as those obtainable with the second embodiment shown in FIG. 5. In the third embodiment, the operation speeds of the 4-bit binary counter 18 and the 4-bit comparator 24 can be significantly lowered for the same reason as that described with reference to the second embodiment shown in FIG. 5. Thus, the third embodiment achieves the similar effects to those of the second embodiment.

Figure 8:
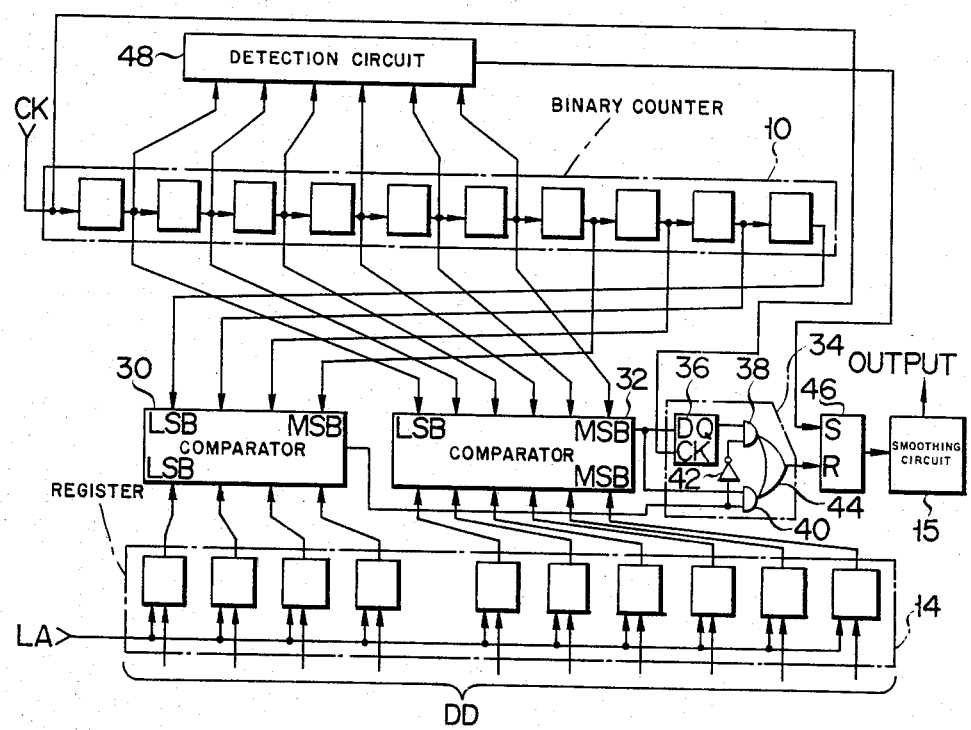
FIG. 8 is a circuit diagram of a DA converter according to the fourth embodiment of the present invention.

FIG. 8 shows a DA converter according to the fourth embodiment of the present invention. The same reference numerals in FIG. 8 as those in FIG. 3 denote the same parts.

The upper four significant bits of the count of the 10-bit binary counter 10 are reversed in the order of bits and are supplied to a 4-bit comparator 30. More specifically, when the upper four significant bits of the count of the 10-bit binary counter 10 are denoted by Q6 to Q9, the most significant bit (hereinafter MSB hereinafter) Q9 is inputted to the LSB of the 4-bit comparator 30. The subsequent bits Q8 and Q7 are inputted to the second and third bits of the 4-bit comparator 30. The bit Q6 is inputted to the MSB of the comparator 30. The lower six significant bits of the count of the 10-bit binary counter 10 are directly supplied to a 6-bit coincidence circuit 32. More specifically, when the lower six significant bits of the binary counter 10 are denoted by Q0 to Q5, the LSB Q0 is supplied to the LSB of the 6-bit coincidence circuit 32. The bits Q1 to Q4 are supplied to the second to fourth bits, and the bit Q5 is supplied to the MSB of the coincidence circuit 32.

The lower four significant bits of the input digital data DD to be converted are also inputted, as a comparison input, to the 4-bit comparator 30. The comparator 30 compares the value (value A) of the lower four bits of the digital data DD with the value (value B) output from the 10-bit binary counter 10. The comparator 30 outputs a signal "0" if A>B while it outputs a signal "1" if A>B. The signal "0" or "1" output from the comparator 30 is supplied to a delay control circuit 34. Meanwhile, the upper six significant bits of the input digital data DD to be converted are also supplied to the 6-bit coincidence circuit 32. The coincidence circuit 32 compares the value (value C) of the upper six significant bits with the value (value D) from the binary counter 10. The coincidence circuit 32 outputs a signal "0" if C≠D, while it outputs a signal "1" if C=D. The signal "0" or "1" generated from the coincidence circuit 32 is supplied to the delay control circuit 34. The delay control circuit 34 comprises a D flip-flop 36, AND circuits 38 and 40 each having two input ends, an inverter 42, and an OR circuit 44. If the output signal from the comprator 30 is "1" (A≦B), the output signal from the coincidence circuit 32 is directly outputted, that is. without delay. On the other hand, if the output signal from the comparator 30 is "0" (A>B), the output signal from the coincidence circuit 32 is outputted with a delay of a duration corresspondding to one period of the clock pulse CK (to be referred to as one clock time hereinafter). Thus, if the output signal from the comparator 30 is "1", the AND circuit 40 is rendered operative to produce the output signal from the coincidence circuit 32 through the AND circuit 40 and the OR circuit 44. On the other hand, if the output signal from the comparator 30 is "0", the AND circuit 38 is rendered operative in response to a signal inputted thereto through the inverter 42. Thus, the output signal from the coincidence circuit 32 is delayed by one clock time by the D flip-flop 36 and is then output through the AND circuit 38 and the OR circuit 44. The clock pulse CK is inputted as a drive pulse to the D flip-flop 36. The output from the coincidence circuit 32 supplied to a data input terminal D of the D flip-flop 36 is outputted with a delay of one clock time. The output from the delay control circuit 34 is supplied to a reset input R of an SR flip-flop 46.

The output from a detection circuit 48 is supplied to a set input S of the SR flip-flop 46. This detection circuit 48 receives the lower six significant bits Q0 to Q5 of the count of the binary counter 10, and generates a pulse when these bits Q0 to Q5 take a predetermined value (if $Q0=Q2=Q3=Q4=Q5=$"0" in this embodiment). Therefore, the SR flip-flop 46 outputs the PWM wave of a pulse width which is corresponding to the data to be compared and which is increased by one quantization unit (one clock time) only if the output signal from the comparator 30 is "0" (A>B).

Since the upper four significant bits Q6 to Q9 from the binary counter 1 are inverted in the order of bits and are input to the comparator 30, the comparator 30 receives a binary number $Q9 \times 2^0 + Q8 \times 2^1 + Q7 \times 2^2 + Q6 \times 2^3$. The bits Q6 to Q9 output from the binary counter 10 and the values input to the comparator 30 correspond in the manner as shown in Table 1 above.

Figure 4:
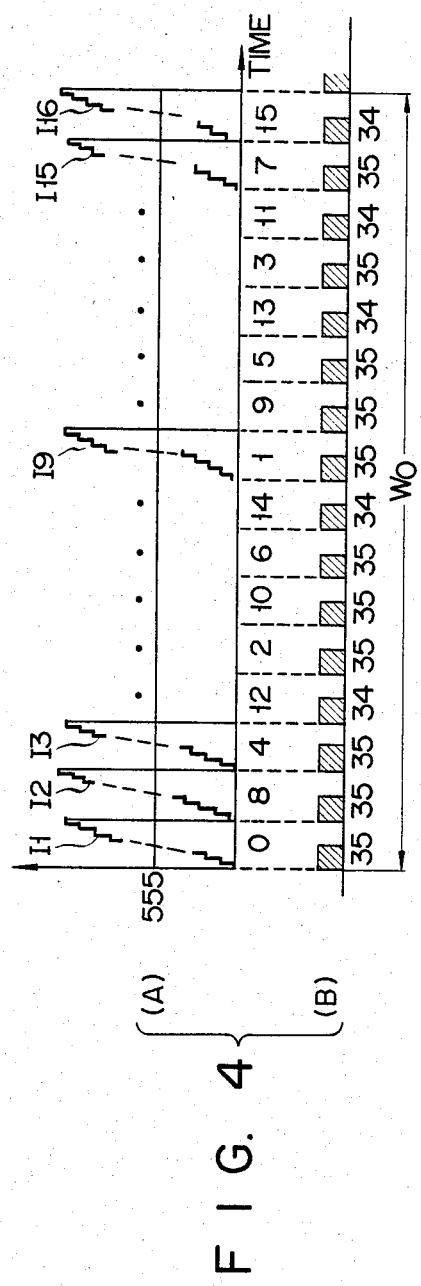
FIGS. 4(A) and 4(B) are views for explaining the mode of operation of the DA converter shown in FIG. 3.

Accordingly, in the fourth embodiment, substantially equal 16 pulse trains having a duty of $34/2^6$ or $35/2^6$ within the conversion period are obtained as shown in FIGS. 4(A) and 4(B) as in the case of the first embodiment. The pulses having a duty of $34/2^6$ are obtained as maximally dispersed among pulses having a duty of $35/2^6$. Therefore, the fourth embodiment has the similar effects to those obtainable with the first embodiment.

Figure 9:
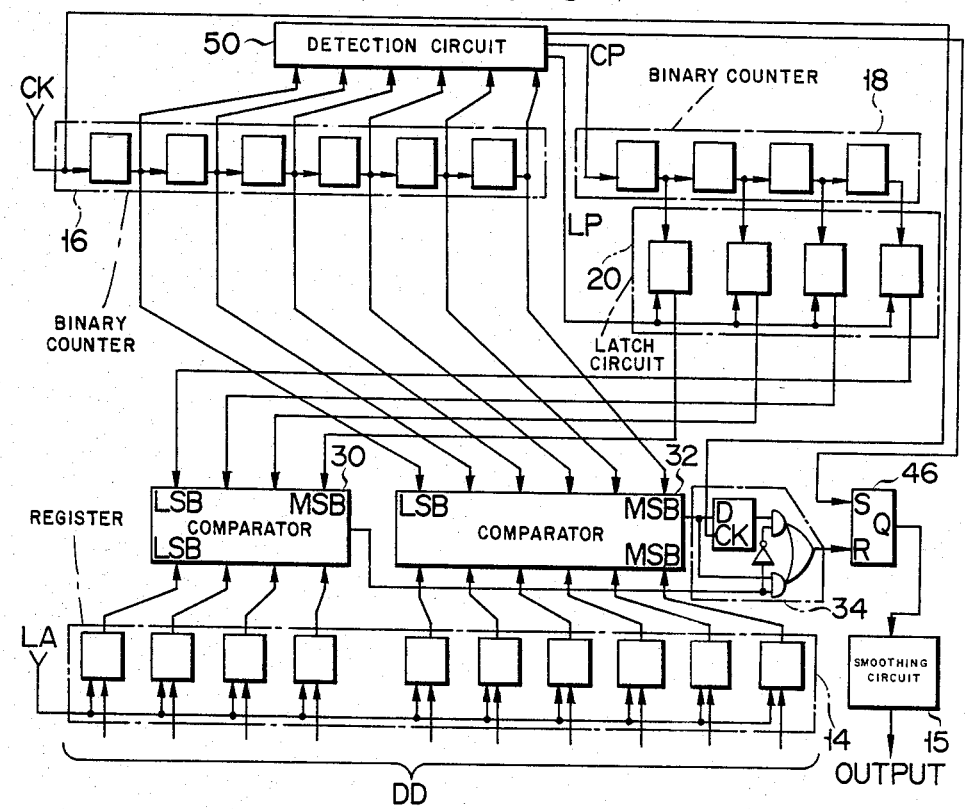
FIG. 9 is a circuit diagram of a DA converter according to the fifth embodiment of the present invention.

FIG. 9 shows a circuit diagram of the fifth embodiment of the present invention. In FIG. 9, the same reference numerals as in FIGS. 5 and 8 denote the same parts.

Figure 10:
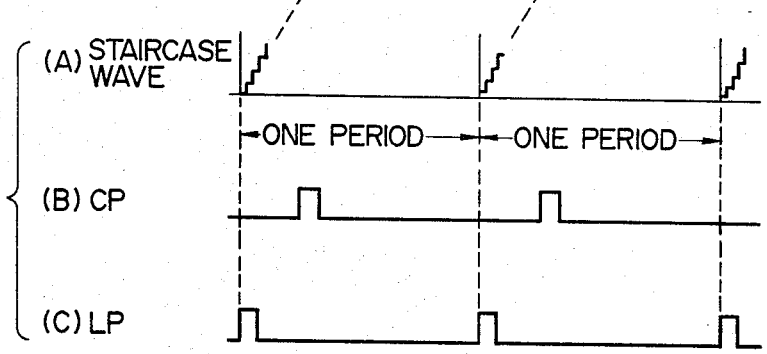
FIGS. 10(A), 10(B) and 10(C) show waveforms for explaining the mode of operation of the DA converter shown in FIG. 9.

The fifth embodiment shown in FIG. 9 differs from the first embodiment in the following respects. The 6-bit binary counter 16, the 4-bit binary counter 18 and the latch circuit 20 are incorporated in place of the 10-bit binary counter 10. The 4-bit binary counter 18 is rendered operative in response to the output (count pulse CP) from a detection circuit 50 which detects if the count of the 6-bit binary counter 16 has reached a predetermined value. The count of the 4-bit binary counter 18 is latched by the latch circuit 20 in response to the output (latch pulse LP) from the detection circuit 50 and is then supplied to the comparator 30. The other configuration remains the same. With the embodiment of this configuration, the operation speed of the 4-bit binary counter 18 can be made significantly lower than that of the 6-bit binary counter 16. As may be seen from the above description, the signal supplied to the comparator remains constant for a duration corresponding to one period of the staircase wave. Therefore, the operation speed of the 4-bit binary counter 18 can be significantly lowered if the count pulse CP for rendering the 4-bit binary counter 18 operative is supplied thereto curing the initial period of the staircase wave, and if the count of the 4-bit binary counter 18 is latched in the latch circuit 20 and is supplied to the comparator 30 after the counting operation of the 4-bit binary counter 18 is completed, as shown in FIGS. 10(A), 10(B) and 10(C). In FIGS. 10(A), 10(B) and 10(C), the latch pulse LP is generated in synchronism with the leading edge of the staircase wave. However, the latch pulse LP need not be generated in synchronism with the leading edge or the trailing edge of the staircase. The latch pulse LP may be generated at the timing as shown in FIGS. 6(A), 6(B) and 6(C). Thus, the timing for generating the latch pulse LP may be arbitrarily set. Accordingly, the fifth embodiment provides the same effects as the second embodiment.

Figure 11:
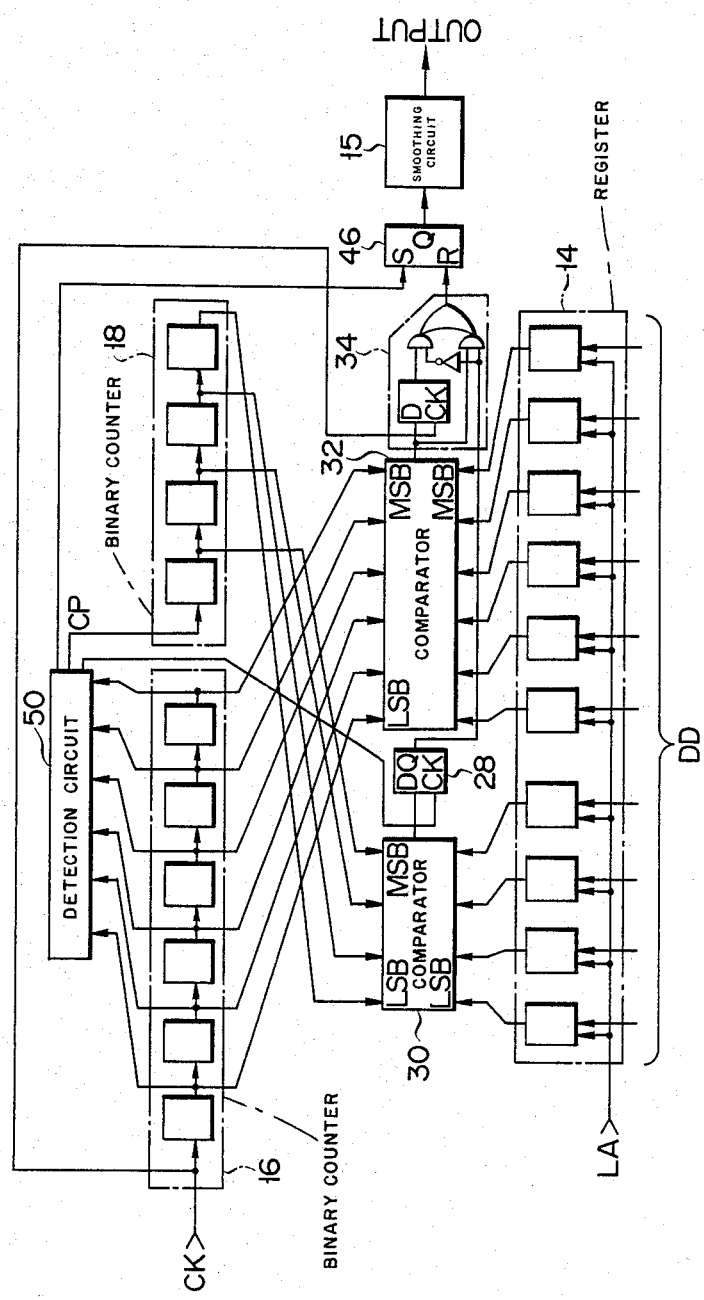
FIG. 11 is a circuit diagram of a DA converter according to the sixth embodiment of the present invention.

FIG. 11 shows the sixth embodiment of the present invention. According to the sixth embodiment, the latch circuit 28 is connected to the output end of the comparator 30 in place of the latch circuit 20 of the fifth embodiment shown in FIG. 9. The output from the comparator 30 is latched in the latch circuit 28 in synchronism with the latch pulse LP output from the detection circuit 50 and is supplied to the delay control circuit 34. Although the mode of operation of the sixth embodiment is basically the same as that of the fifth embodiment shown in FIG. 9, the operation speeds of the 4-bit binary counter 18 and the comparator 30 may be significantly lowered by suitably selecting the timings at which the count pulse CP to be supplied to the 4-bit binary counter 18 and the latch pulse LP to be supplied to the latch circuit 28 are generated. In this manner, the sixth embodiment also provides the same effects as the second embodiment.

The present invention is not limited to the first to sixth embodiments described above. For example, in the first to sixth embodiments. the present invention is applied to a 10-bit PWM-type DA converter. However, the present invention can be applied to PWM-type DA converters having any number of bits. In the embodiments described above, the number of bits of each staircase wave and the number of bits of the weight were divided into four and six bits. These bits may be divided in many ways depending upon the purpose. In the embodiments described above, the binary counters comprise up-counters. Therefore, the sawtooth waves were generated as the staircase waves. However, if the binary counters comprise up-down counters, the staircase waves of triangular shape may be obtained. A DA converter of similar effects may be obtained in this case. The binary counters may comprise down-counters or synchronous counters.

In FIG. 8, the coincidence output signal from the coincidence circuit 32 may be inputted to the D flip-flop 36. And the signal delayed by one clock time in response to the clock pulse CK may be supplied to the D input of the D flip-flop 36 and to the input end of the AND circuit 40. In this manner, the error due to logic delay of the coincidence circuit 32 may be reduced.

Various other changes and modifications may be made within the scope and spirit of the present invention.

What is claimed is:
1. A DA converter comprising:
 storing means for temporarily storing N-bit digital data to be DA converted;

digital value string generating means for counting pulses of a predetermined frequency to sequentially binary numbers, said generating means comprising an n-bit (n<N+1) binary counter;

a detection circuit which is connected to said n-bit binary counter, for detecting when a count of said n-bit binary counter has reached first and second preset numbers and outputtting a clock signal when the count of said n-bit binary counter reaches the first preset number and outputting a latch signal when the count of said n-bit binary counter reaches the second preset number;

an (N−n) binary counter which is connected to said detection circuit and for incrementing its count thereof upon receipt of said clock signal from said detection circuit;

N-bit comparing means connected to said storing means and said digital value string generating means, for sequentially comparing each of the plurality of digital value strings with the digital data so as to output pulses corresponding to the number of the digital value strings, said N-bit comparing means including:

a first comparator for comparing the count from said N-bit counter, in an inverted order, with the lower significant n-bits of the N-bit data to be converted, a latch circuit which is connected to the outputs of said first comparator and said detection circuit or latching an output from said first comparator in response to the latch signal from said detection circuit, and a second comparator which is connected to the output of said latch circuit, for comparing the contents of the n-bit counter with the higher significant n-bits of the N-bit data to be converted and for producing a comparison output signal with a control priority over an output from said latch circuit; and smoothing means, connected to said N-bit comparing means, for converting the output of said N-bit comparing means into an analog signal representing said N-bit digital clock.

2. A DA converter according to claim 1, wherein said n-bit binary counter comprises a synchronous binary counter.

3. A DA converter comprising:

storing means for temporarily storing N-bit digital data to be DA converted;

digital value string generating means for counting pulses of a predetermined frequency to generate a plurality of dispersed digital value strings to be compared with the digital data within one conversion period and in correspondence with digital values varying within the conversion period;

N-bit comparing means, connected to said storing means and said digital value string generating means, for sequentially comparing each of the plurality of digital value strings with the digital data so as to output pulses corresponding to the number of the digital value strings, said N-bit comparing means coupled to the outputs of said n-bit binary counter for receiving the upper significant (N−n+1)th to Nth bits, and of said (N−n) bit binary counter for receiving the least significant bit to (N−n)th bits; and smoothing means connected to said N-bit comparing means, for converting the pulses generated within the conversion period by said N-bit comparing means into an analog signal, wherein said digital value string generating means comprises an n-bit (n−1<N) binary counter for counting the pulses of the predetermined frequency to sequentially generate binary numbers, a detection circuit which is connected to said n-bit binary counter which detects if a count of said n-bit binary counter has reached first and second preset numbers and which outputs a clock signal when the count of said n-bit binary counter reaches the first preset number and outputs a latch signal when the count of said n-bit binary counter reaches the second preset number, and an (N−n) bit binary counter which is connected to said detection circuit and which increments a count thereof by one when the clock signal is received, said n-bit binary counter supplying an output thereof to upper significant (N−n+1)th to Nth bits of said N-bit comparing means, and said (N−n) bit binary counter supplying an inverted output to the least significant bit to (N−n)th bits of said N-bit comparing means.

4. A DA converter according to claim 3, wherein said N-bit comparing means comprises a first comparator for comparing contents of the least significant bit to (N−n)th bit; a latch circuit which is connected to said comparator and said detection circuit and which latches an output from said first comparator in response to the latch signal; and a second comparator whicn is connected to said latch circuit and which compares the contents of upper significant (N−n+1)th to Nth bits and produces a comparison output with a priority over an output from said latch circuit.

* * * * *